US007341823B2

(12) United States Patent
Meshulach

(10) Patent No.: US 7,341,823 B2
(45) Date of Patent: Mar. 11, 2008

(54) SYSTEM AND METHOD FOR PRINTING A PATTERN

(75) Inventor: Doron Meshulach, Ramat-Gan (IL)

(73) Assignee: Applied Materials, Israel, Ltd., Rehovot (IL)

( * ) Notice: Subject to any disclaimer, the term of this patent is extended or adjusted under 35 U.S.C. 154(b) by 783 days.

(21) Appl. No.: 10/765,673

(22) Filed: Jan. 26, 2004

(65) Prior Publication Data

US 2005/0162766 A1 Jul. 28, 2005

(51) Int. Cl.
*G03F 7/00* (2006.01)

(52) U.S. Cl. ....................................... 430/311; 430/322

(58) Field of Classification Search ................ 430/311, 430/322; 372/22
See application file for complete search history.

(56) References Cited

U.S. PATENT DOCUMENTS 6,020,591 A 2/2000 Harter et al.
6,316,153 B1 11/2001 Goodman et al.

FOREIGN PATENT DOCUMENTS

JP 03-203823 * 9/1991

OTHER PUBLICATIONS

Tsang, Thomas Y.F., "Optical Third Harmonic Generation at Interfaces", Nov. 1995, The American Physical Society, Physical Review A, vol. 52 (5), p. 4116-4125.*

Barad, Y, et al., "Nonlinear Scanning Laser Microscopy by Third Harmonic Generation", *Appl. Phys. Lett. 70* (8), (Feb. 24, 1997), 3 pgs.

Meshulach, D, et al., "Measurement of Ultrashort Optical Pulses by Third-Harmonic Generation", *J. Opt. Soc. Am. B*/vol. 14, (Aug. 8, 1997), 4 pgs.

Tsang, Thomas, et al., "Frequency-Resolved Optical-Gating Measurements of Ultrashort Pulses Using Surface Third-Harmonic Generation", vol. 21, No. 17/*Optics Letters*, (Sep. 1, 1996), 3 pgs.

Wu, En S, et al., "Two-Photon Lithography For Microelectronic Application", *SPIE*-vol. 1674 *Optical/Laser Microlithography V*, (1992), 7 pgs.

Yelin, D, et al., "Third-Harmonic Microscopy With A Titanium-Sapphire Laser", *Appl. Phys. B 74*, (Jun. 27, 2002), 5 pgs.

* cited by examiner

*Primary Examiner*—Mark F. Huff
*Assistant Examiner*—Caleen O. Sullivan
(74) *Attorney, Agent, or Firm*—Tarek N. Fahmi

(57) ABSTRACT

A system and method for printing a pattern, using third harmonic generation. The method includes: (i) determining an illumination scheme in response to the pattern; and (ii) directing, in response to the determination, at least one beam of radiation having a fundamental frequency, via a medium, towards an intermediate layer such as to excite at least one third harmonic beam that propagates through at least a portion of the intermediate layer towards a radiation sensitive layer; whereas the radiation sensitive layer is sensitive to third harmonic radiation and is substantially not sensitive to radiation of the fundamental frequency.

9 Claims, 3 Drawing Sheets

10

120

SYSTEM AND METHOD FOR PRINTING A PATTERN

FIELD OF THE INVENTION

The present invention relates to systems and methods for printing patterns and especially systems and methods for utilizing third harmonic signals for printing sub-micron pattern on wafers and masks.

BACKGROUND OF THE INVENTION

Third Harmonic Generation Phenomenon

Third harmonic generation is a well known nonlinear optical phenomenon (see for example R. W. Boyd, Nonlinear Optics, Academic Press, San Diego, 1992). Briefly, nonlinearities in the response of a material to an illumination laser field give rise to new frequency components of the optical field that correspond to the third harmonic of the frequency of the illumination field. It is known that third harmonic signals can be generated by focusing a laser beam close to material interfaces, and to thin layers embedded within media. This phenomenon of surface third harmonic generation has been demonstrated experimentally for a variety of materials and interfaces (see for example T. Y. F. Tsang, "Optical third-harmonic generation at interfaces", Physical Review A, 52 (5), 4116, November (1995)).

Surface third harmonic generation has found applications in nonlinear microscopy (See for example Y. Barad, H. Eisenberg, M. Horowitz, and Y. Silberberg, "Nonlinear scanning laser microscopy by third harmonic generation", Applied Physics Letters, 70 (8), 24, 922 (1997), D. Yelin, D. Oron, E. Korkotian, M. Segal, and Y. Silberberg, "Third-harmonic microscopy with a titanium-sapphire laser", Applied Physics B, 74, S97 (2002)).

U.S. Pat. No. 5,828,459 of Silberberg describes a scanning laser microscope that uses third harmonic generation for acquiring high resolution images.

Briefly, when radiation beam having a fundamental frequency $\omega$ is focused onto an interface defined by two materials that are characterized by different $\chi^{(3)}$ (third order nonlinear susceptibility) third harmonic signals (signals having a frequency of $3\omega$) are generated.

Surface third harmonic generation has also found applications in ultrashort pulse characterization (see for example T. Tsang, M. A. Krumbügel, K. W. DeLong, D. N. Fittinghoff, and R. Trebino, "Frequency-resolved optical-gating measurements of ultrashort pulses using surface third-harmonic generation", Optics Letters, 21 (17), 1381 (1996), and D. Meshulach, Y. Barad, and Y. Silberberg, "Measurement of ultrashort optical pulses by third-harmonic generation", Journal of Optical Society of America B, 14 (8), 2122 (1997)).

Integrated Circuit Lithography

Integrated circuits are very complex devices that include multiple layers. Some layers may include conductive material and isolating material while other layers may include semi-conductive materials. These various materials are arranged in patterns, usually in accordance with the expected functionality of the integrated circuit. The patterns also reflect the manufacturing process of the integrated circuits.

Integrated circuits are manufactured by complex multi-staged manufacturing processes. During these multi-staged processes, radiation resistive (usually termed photoresist) material is deposited on a substrate/layer, exposed by a photolithographic process, and developed to produce a pattern that defines some areas to be later etched. After the pattern is etched, various materials, such as copper are deposited. The deposition process is usually followed by a polishing process. Materials can be polished by chemical processes and/or a combination of chemical as well as mechanical processes.

The size of the features of integrated circuits continues to shrink and there is a growing need to provide methods and systems for improving the resolution and reducing the size of printed features of lithography systems and lithography methods.

SUMMARY OF THE INVENTION

The invention provides a method for printing a pattern utilizing third harmonic generation, the method includes: (i) determining an illumination scheme in response to the pattern; and (ii) allowing, in response to the determination, at least one beam of optical radiation having a fundamental frequency, to propagate via a medium, towards an intermediate layer such as to excite at least one third harmonic beam that propagates through at least a portion of the intermediate layer towards a radiation sensitive layer; whereas the radiation sensitive layer is sensitive to third harmonic radiation and is substantially not sensitive to radiation of the fundamental frequency.

The invention provides a system for printing a pattern, the apparatus includes: (i) a controller, for determining an illumination scheme in response to the pattern; and (ii) optics, connected to the controller, for directing, in response to the determination, at least one beam of radiation having a fundamental frequency, via a medium, towards an intermediate layer such as to excite at least one third harmonic beam that propagates through at least a portion of the intermediate layer towards a radiation sensitive layer; whereas the radiation sensitive layer is sensitive to third harmonic radiation and is substantially not sensitive to radiation of the fundamental frequency.

Conveniently, the focal point of the beam of fundamental frequency is located at the vicinity of an interface between the medium and the intermediate layer. This vicinity can be limited by the confocal length of the fundamental frequency beam. Preferably, the focal point of the beam of fundamental frequency is substantially located at said interface.

Conveniently, the beam of fundamental frequency is characterized by a short duration, such as but not limited to femtoseconds and even picoseconds, and/or by high intensity.

Conveniently, the fundamental frequency is within the ultra violet and extreme ultra violet spectral range.

BRIEF DESCRIPTION OF THE DRAWINGS

The present invention will be more fully understood from the following detailed description of the embodiments thereof, taken together with the following figures.

DETAILED DESCRIPTION OF THE DRAWINGS

For purposes of this specification and the accompanying claims, the term "printing" also includes "writing" and "recording".

Figure 1:
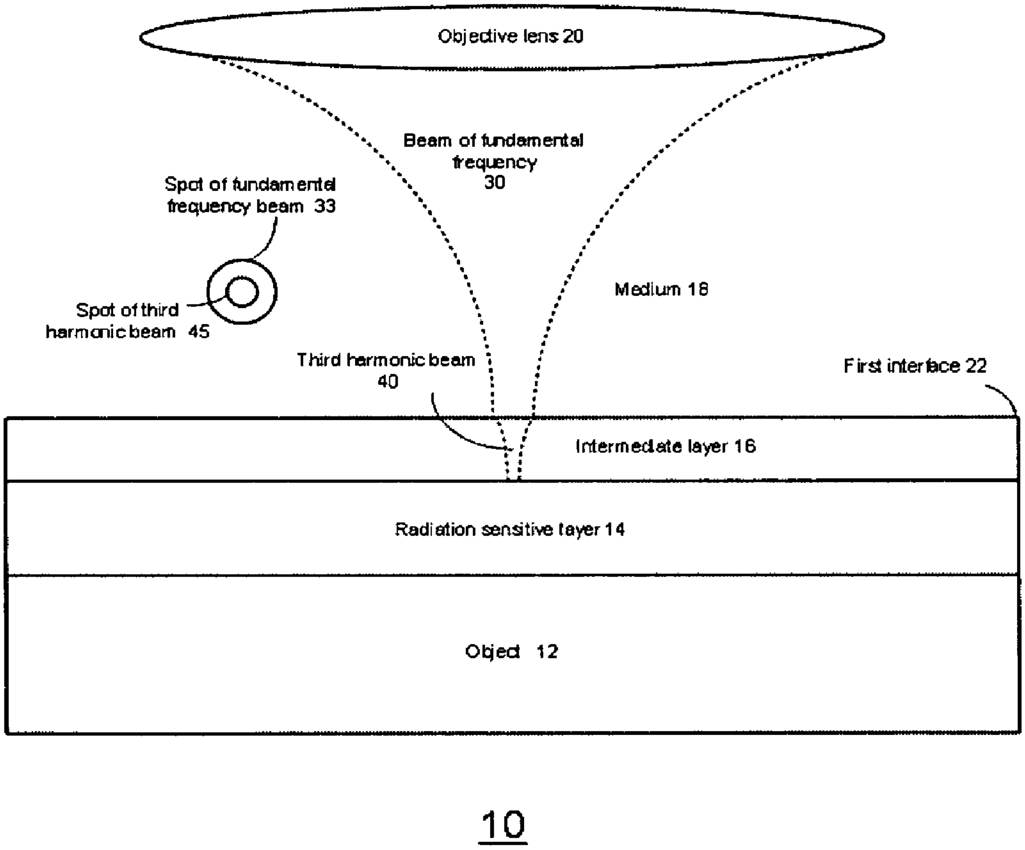
FIG. 1 illustrates a surrounding in which a third harmonic beam is generated, according to an embodiment of the invention.

FIG. 1 illustrates a surrounding 10 in which a third harmonic beam is generated, according to an embodiment of the invention. A beam of fundamental frequency 30 is focused to a spot size 33, by an objective lens 20, substantially onto a first interface 22 defined by the medium 18 (through which beam 30 propagates) and an intermediate layer 16, such as to generate a third harmonic beam 40. The third harmonic beam 40 having a spot size 45 is generated within intermediate layer 16, conveniently at the vicinity of the first interface 22, and propagates through the intermediate layer 16 towards radiation sensitive layer 14.

Figure 2:
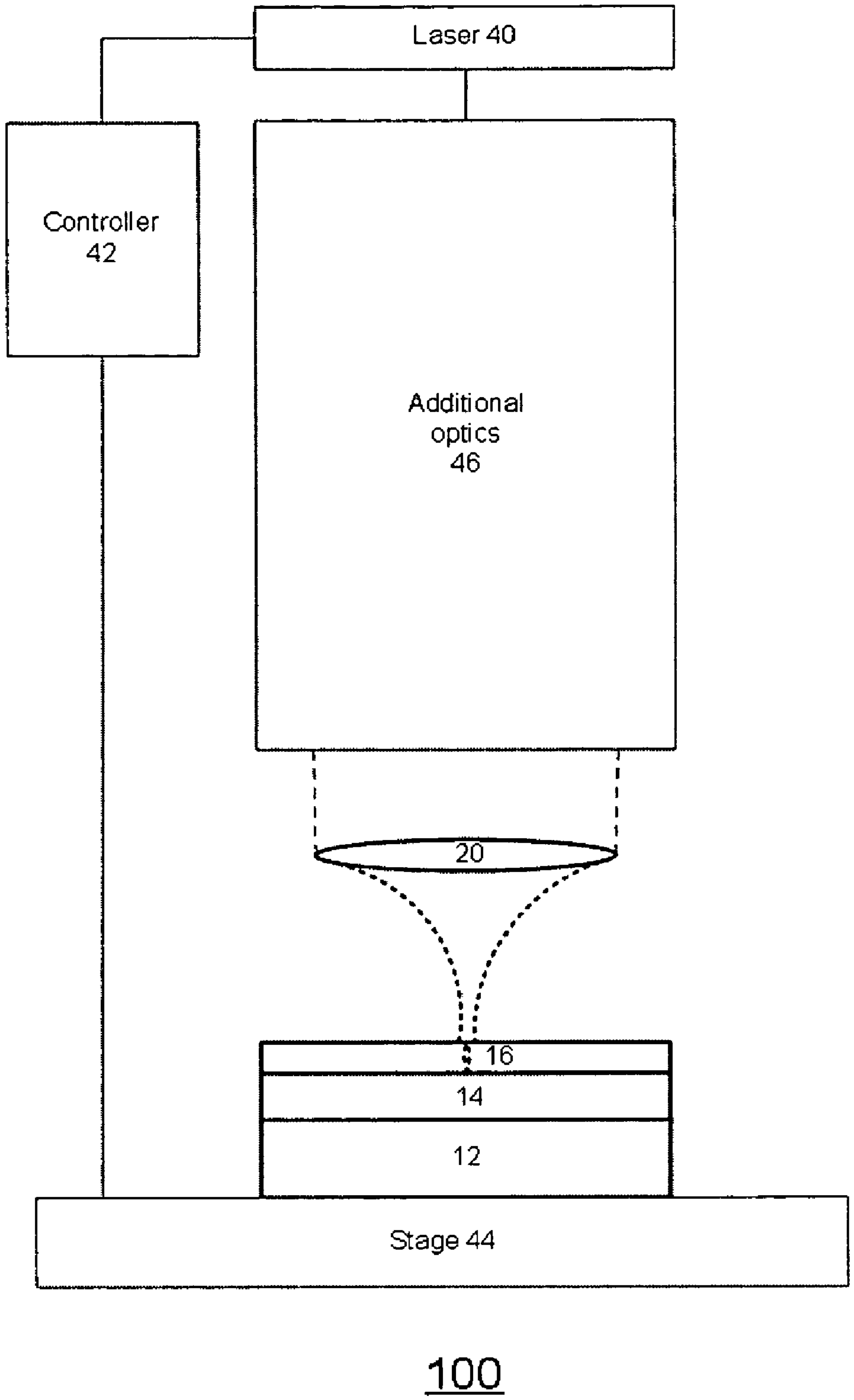
FIG. 2 illustrates a lithography system, according to an aspect of the invention.

Referring to FIG. 2, illustrating a system 100 that includes a controller 42 as well as optics. The optics may include, for example, additional optics 46 as well as a radiation source, such as femtosecond laser 40 having a fundamental wavelength of few hundred nanometer and shorter wavelength. Laser 40 is controlled by the controller 42 that is capable of transforming a pattern into an illumination pattern. The controller 42 usually co-operates with (or controls) a stage 44 that supports the object 12 and provides a relative translation between the focused beam and the object. Additional optics 46 is usually positioned between laser 40 and objective lens 20, said additional optics may include collimating optics, polarizing optics, focusing optics, filters and the like. At least a part of said additional optics 46 (for example programmable filters) can be controlled by controller 42.

In order to print patterns with the resolution of the third harmonic beam 40 and not to print patterns with the resolution of the fundamental frequency beam 30 by the part of the fundamental beam not converted to third harmonic beam, the radiation sensitive layer is substantially not sensitive to the fundamental frequency beam and substantially sensitive to the third harmonic beam.

The radiation sensitive layer is characterized by a threshold (denoted TH) that must be exceeded in order to record a shape. Usually, TH is wavelength dependent. In mathematical terms: $Sen_{3\omega} x I_{3\omega} > TH$ and $Sen_{\omega} x I_{\omega} < TH$, where $Sen_{3\omega}$ is the sensitivity of the radiation sensitive layer 14 to third harmonic radiation, $Sen_{\omega}$ is the sensitivity of the radiation sensitive layer 14 to fundamental frequency, $I_{3\omega}$ is the intensity of third harmonic frequency radiation that interacts with the radiation sensitive layer 14, $I_{\omega}$ is the intensity of the fundamental harmonic radiation that interacts with the radiation sensitive layer 14.

According to various embodiments of the invention $Sen_{\omega}$ is substantially zero. This is of great significance as usually $I_{\omega}$ is much greater than $I_{3\omega}$.

It is noted that although FIG. 1 illustrates a single beam, a typical pattern is usually printed by multiple beams. A lithography process may selectively direct multiple beams towards the intermediate layer simultaneously (for example by using a stepper like lithography scheme, or by selectively scanning the intermediate layer) or may direct only one beam at a time towards the intermediate layer and selectively scan the layer to print the pattern.

Accordingly, the single objective lens 20 may be replaced by an array of lenses or microlenses for increasing the throughput of the lithography system.

Methods for single beam and multiple beam lithography and especially for determining illumination schemes in response to a predefined pattern are known in the art and do not require further explanations. Exemplary multiple beam lithography systems are illustrated in U.S. patent applications 20010331029 and U.S. 20010331035 of Almogy. It is noted that scanning patterns should be adapted to the narrower third harmonic focused beams.

Conveniently, the intermediate layer 16 is thinner than the confocal length of the beam of fundamental frequency 30, to prevent significant defocusing of the third harmonic beam 40.

A Gaussian focused light beam can be characterized by its minimum size (diameter) $2S_0$ (also referred to as focal spot size) and by its confocal length. The latter being the distance (along the optical axis of the beam) in which the spot expands from its minimum size $2S_0$ to a radius of $\sqrt{2}S_0$.

Conveniently, the distance between the first interface 22 and the focal point of the fundamental frequency beam 30 is less than its confocal length. Thus, the radius of fundamental frequency beam 30 at the first interface 22 is less than $\sqrt{2}S_0$. Preferably, the focal point of the fundamental frequency beam 30 is positioned exactly at the first interface 22 or at the vicinity of the first interface 22.

Conveniently, the index of refraction of the medium 18 differs from that of the intermediate layer 16. The medium may be air but this is not necessarily so and other materials, such as those which facilitate immersion lithography, can be used.

For a Gaussian beam, it is known that the third harmonic frequency is generated with a confocal parameter that is equal to that of the fundamental beam. Further, the minimum size of the third harmonic focused beam is $\sqrt{3}$ times smaller than that of the fundamental beam.

Figure 3:
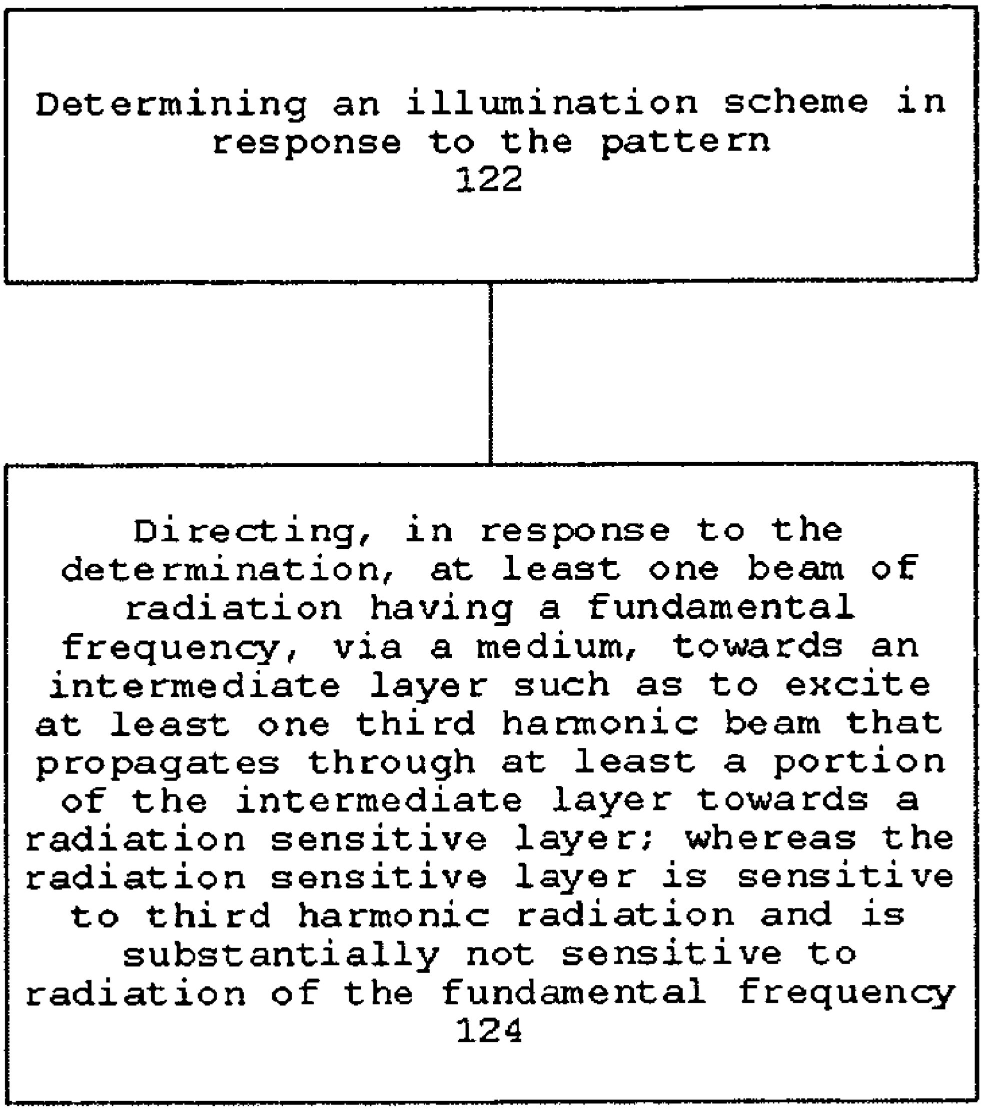
FIG. 3 is a flow chart of method for printing a pattern, according to an embodiment of the invention.

FIG. 3 is a flow chart of method 120 for printing a pattern. It includes step 122 of determining an illumination scheme in response to the pattern, and step 124 of directing, in response to the determination, at least one beam of radiation having a fundamental frequency, via a medium, towards an intermediate layer such as to excite at least one third harmonic beam that propagates through at least a portion of the intermediate layer towards a radiation sensitive layer; whereas the radiation sensitive layer is sensitive to third harmonic radiation and is substantially not sensitive to radiation of the fundamental frequency.

Conveniently, the intermediate layer should be removed after the pattern is printed.

It should be noted that the particular terms and expressions employed and the particular structural and operational details disclosed in the detailed description and accompanying drawings are for illustrative purposes only and are not intended in any way to limit the scope of the invention as described in the appended claims.

It will thus be appreciated that the preferred embodiments described above are cited by way of example, and that the present invention is not limited to what has been particularly shown and described hereinabove. Rather, the scope of the present invention includes both combinations and sub-combinations of the various features

I claim:

1. A method comprising:

determining an illumination scheme in response to a pattern; and printing the pattern, wherein said printing comprises directing, in response to the determination, at least one incident beam of radiation via a medium, towards an intermediate layer, each said incident beam having a fundamental frequency and serving to excite and propagate a third harmonic beam through at least a portion of the intermediate layer towards a radiation sensitive layer, said radiation sensitive layer being sensitive to third harmonic radiation and substantially not sensitive to radiation of the fundamental frequency.

2. The method of claim 1 wherein the printing step comprises focusing each incident beam of radiation onto the intermediate layer.

3. The method of claim 2 wherein a focal point of each incident beam is substantially located at an interface defined by the medium and the intermediate layer.

4. The method of claim 1 wherein (i) the product of the sensitivity of the radiation sensitive layer to third harmonic radiation and the intensity of the third harmonic radiation is greater than a radiation sensitive layer threshold, and (ii) the product of the sensitivity of the radiation sensitive layer to fundamental radiation and the intensity of the fundamental radiation is less than the threshold.

5. The method of claim 1 wherein each incident beam is characterized by a short duration.

6. The method of claim 1 wherein each incident beam is characterized by high intensity.

7. The method of claim 1 wherein each fundamental frequency is within the ultraviolet and extreme ultraviolet spectral range.

8. The method of claim 1 further comprising directing at least two of the incident beams simultaneously towards at least two respective locations of the intermediate layer.

9. The method of claim 1 wherein a $\chi^{(3)}$ of the medium differs from a $\chi^{(3)}$ of the intermediate layer.

* * * * *